(12) United States Patent
Lin

(10) Patent No.: US 8,634,243 B2
(45) Date of Patent: Jan. 21, 2014

(54) DATA WRITING METHOD AND DATA STORAGE DEVICE

(75) Inventor: Cheng-Wei Lin, Guishan Township, Taoyuan County (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 212 days.

(21) Appl. No.: 13/084,147

(22) Filed: Apr. 11, 2011

(65) Prior Publication Data
US 2011/0280074 A1 Nov. 17, 2011

(30) Foreign Application Priority Data
May 11, 2010 (TW) ................................ 99114905 A

(51) Int. Cl.
*G11C 11/34* (2006.01)
(52) U.S. Cl.
USPC ............. 365/185.11; 365/185.03; 365/185.22
(58) Field of Classification Search
USPC ............. 365/185.11, 185.03, 185.23, 185.22, 365/185.05; 711/103, 206, 165, 162, 170, 711/154
See application file for complete search history.

(56) References Cited

U.S. PATENT DOCUMENTS

| | | | | |
|---|---|---|---|---|
| 2010/0005229 A1* | 1/2010 | Hsiao | ............................ | 711/103 |
| 2010/0061148 A1* | 3/2010 | Komatsu | .................. | 365/185.03 |
| 2010/0070688 A1* | 3/2010 | Lin | ............................... | 711/103 |

* cited by examiner

*Primary Examiner* — Son Dinh
(74) *Attorney, Agent, or Firm* — McClure, Qualey & Rodack, LLP

(57) ABSTRACT

The invention provides a data writing method for a flash memory. First, a target block for storing write data is selected from a plurality of blocks of the flash memory. A target pair page is then selected from a plurality of pair pages of the target block according to a pair page record table, wherein the pair page comprises a strong page and a weak page. The flash memory is then directed to write a data page of the write data to the strong page of the target pair page. The flash memory is then also directed to write first predetermined data to the weak page of the target pair page, wherein the weak page storing the first predetermined data extends the data duration of the strong page of the target pair page. Selecting of the target pair page, writing of the data page, and writing of the first predetermined data are repeated until all of the write data are written to the target block.

16 Claims, 8 Drawing Sheets

|  | Strong page (Storing LSB) | Weak page (Storing CSB) | Very weak page (Storing MSB) |
|---|---|---|---|
| Pair page | 0 | 4 | 10 |
|  | 1 | 5 | 11 |
|  | 2 | 8 | 16 |
|  | 3 | 9 | 17 |
|  | 6 | 14 | 22 |
|  | 7 | 15 | 23 |
|  | 12 | 20 | 28 |
|  | 13 | 21 | 29 |
|  | ⋮ | ⋮ | ⋮ |
|  | 180 | 186 | 190 |
|  | 181 | 187 | 191 |

| Page | P0 (S0) | P1 (S1) | P2 (S2) | P3 (S3) | P4 (W0) | P5 (W1) | P6 (S4) | P7 (S5) | P8 (W2) | P9 (W3) | P10 (VW0) | P11 (VW1) | ... | P16 (VW2) | P17 (VW3) |
|---|---|---|---|---|---|---|---|---|---|---|---|---|---|---|---|
| Data | D1 | | | | DA | | | | | | DB | | | | |

FIG. 4B

| Page | P0 (S0) | P1 (S1) | P2 (S2) | P3 (S3) | P4 (W0) | P5 (W1) | P6 (S4) | P7 (S5) | P8 (W2) | P9 (W3) | P10 (VW0) | P11 (VW1) | ... | P16 (VW2) | P17 (VW3) |
|---|---|---|---|---|---|---|---|---|---|---|---|---|---|---|---|
| Data | D1 | D2 | | | DA | DA | | | | | DB | DB | | | |

FIG. 4C

| Page | P0 (S0) | P1 (S1) | P2 (S2) | P3 (S3) | P4 (W0) | P5 (W1) | P6 (S4) | P7 (S5) | P8 (W2) | P9 (W3) | P10 (VW0) | P11 (VW1) | ... | P16 (VW2) | P17 (VW3) |
|---|---|---|---|---|---|---|---|---|---|---|---|---|---|---|---|
| Data | D1 | D2 | D3 | | DA | DA | | | DA | | DB | DB | | DB | |

| Page | P0 (S0) | P1 (S1) | P2 (S2) | P3 (S3) | P4 (W0) | P5 (W1) | P6 (S4) | P7 (S5) | P8 (W2) | P9 (W3) | P10 (VW0) | P11 (VW1) | ... | P16 (VW2) | P17 (VW3) | ... |
|---|---|---|---|---|---|---|---|---|---|---|---|---|---|---|---|---|
| Data | D1 | D2 | D3 | D4 | | | | | | | | | | | | |

FIG. 7A

| Page | P0 (S0) | P1 (S1) | P2 (S2) | P3 (S3) | P4 (W0) | P5 (W1) | P6 (S4) | P7 (S5) | P8 (W2) | P9 (W3) | P10 (VW0) | P11 (VW1) | ... | P16 (VW2) | P17 (VW3) | ... |
|---|---|---|---|---|---|---|---|---|---|---|---|---|---|---|---|---|
| Data | D1 | D2 | D3 | D4 | DA | DA | D5 | D6 | | | | | | | | |

FIG. 7B

| Page | P0 (S0) | P1 (S1) | P2 (S2) | P3 (S3) | P4 (W0) | P5 (W1) | P6 (S4) | P7 (S5) | P8 (W2) | P9 (W3) | P10 (VW0) | P11 (VW1) | ... | P16 (VW2) | P17 (VW3) | ... |
|---|---|---|---|---|---|---|---|---|---|---|---|---|---|---|---|---|
| Data | D1 | D2 | D3 | D4 | DA | DA | D5 | D6 | DA | DA | DB | DB | | | | |

FIG. 7C

DATA WRITING METHOD AND DATA STORAGE DEVICE

CROSS REFERENCE TO RELATED APPLICATIONS

This application claims priority of Taiwan Patent Application No. 99114905, filed on May 11, 2010, the entirety of which is incorporated by reference herein.

BACKGROUND OF THE INVENTION

1. Field of the Invention

The invention relates to flash memories, and more particularly to data writing of flash memories.

2. Description of the Related Art

Flash memories are divided into single level cell (SLC) flash memories, multi level cell (MLC) flash memories, and triple level cell (TLC) flash memories. A memory cell of an SLC flash memory stores a single data bit. On the other hand, a memory cell of an MLC flash memory stores two data bits, and a memory cell of a TLC flash memory stores three data bits. If an SLC flash memory has the same number of memory cells with those of an MLC flash memory and a TLC flash memory, the data capacity of the MLC flash memory is double that of the SLC flash memory, and the data capacity of the TLC flash memory is triple of that of the SLC flash memory.

A memory cell of an MLC flash memory stores two data bits, wherein one of the data bits is a least significant bit (LSB), and the other of the data bits is a most significant bit (MSB). A plurality of pages of the MLC flash memory are therefore divided into a plurality of pair pages, and each pair page comprises a strong page and a corresponding weak page, wherein the strong page comprises the least significant bits of a set of memory cells, and the weak page comprises the most significant bits of the same set of memory cells. Because the strong page and the weak page of a pair page store data in a single set of memory cells, the data content stored in the strong page affects the data content stored in the corresponding weak page, and the data content stored in the weak page affects the data content stored in the corresponding strong page.

A memory cell of a TLC flash memory stores three data bits, wherein one of the data bits is a least significant bit (LSB), another of the data bits is a center significant bit (CSB), and the other of the data bits is a most significant bit (MSB). A plurality of pages of the MLC flash memory are therefore divided into a plurality of pair pages, and each pair page comprises a strong page, a weak page, and a very weak page, wherein the strong page comprises the least significant bits of a set of memory cells, the weak page comprises the center significant bits of the same set of memory cells, and the very weak page comprises the most significant bits of the same set of memory cells. Because the strong page, the weak page, and the very weak page of a pair page store data in a single set of memory cells, the data content stored in the strong page affects the data content stored in the corresponding weak page and very weak page, and the data content stored in the weak page and the very weak page affects the data content stored in the corresponding strong page.

Referring to FIG. 1, a schematic diagram of a plurality of pair pages of a block of a TLC flash memory is shown. The block of the TLC flash memory comprises 192 pages with page numbers ranging from 0~191, wherein every three pages form a pair page, and the block, therefore, comprises 64 pair pages. A first pair page comprises pages with page numbers 0, 4, and 10, wherein the page 0 is a strong page, the page 4 is a weak page, and the page 10 is a very weak page. A second pair page comprises pages with page numbers 1, 5, and 11, wherein the page 1 is a strong page, the page 5 is a weak page, and the page 11 is a very weak page. A third pair page comprises pages with page numbers 2, 8, and 16, wherein the page 2 is a strong page, the page 8 is a weak page, and the page 16 is a very weak page.

When data is stored in a flash memory, the data can only be read from the flash memory with a limited frequency threshold. If the data is read from the flash memory with a frequency greater than the frequency threshold, read-out data read from the flash memory would have a high error rate. The frequency threshold is referred to as data retention. For managing the data access of the flash memory, a controller stores important system data in the flash memory. To maintain the correctness of the important system data, the data retention of the system data must be extended. A data writing method capable of extending data retention of system data for a flash memory is therefore required.

BRIEF SUMMARY OF THE INVENTION

The invention provides a data writing method for a flash memory. First, a target block for storing write data is selected from a plurality of blocks of a flash memory. A target pair page is then selected from a plurality of pair pages of the target block according to a pair page record table, wherein the pair page comprises a strong page and a weak page. The flash memory is then directed to write a data page of the write data to the strong page of the target pair page. The flash memory is then also directed to write first predetermined data to the weak page of the target pair page, wherein the weak page storing the first predetermined data extends the data duration of the strong page of the target pair page. Selecting of the target pair page, writing of the data page, and writing of the first predetermined data are repeated until all of the write data are written to the target block.

The invention provides a data writing method for a flash memory. First, a target block for storing write data is selected from a plurality of blocks of the flash memory. A target page is then selected from a plurality of pages of the target block. Whether the target page is a strong page is then determined according to a pair page record table. When the target page is the strong page, the flash memory is directed to write a data page of the write data to the target page. When the target page is not the strong page, the flash memory is directed to write predetermined data to the target page, wherein the weak page storing the first predetermined data extends the data duration of the strong page of the target pair page. Selecting of the target page, determining of whether the target page is the strong page, and writing of the data page or writing of the predetermined data are then repeated until all of the write data are written to the target block.

The invention also provides a data storage device. In one embodiment, the data storage device comprises a flash memory and a controller. The flash memory comprises a plurality of blocks, wherein each of the blocks comprises a plurality of pair pages, and each of the pair pages comprises a strong page and a weak page. The controller is coupled to the flash memory, selects a target block from a plurality of blocks of the flash memory, writes user data or system data to the strong pages of the target block, and writes first predetermined data to the weak pages of the target block, wherein the weak pages storing the first predetermined data extends the data duration of the corresponding strong pages.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 1 is a schematic diagram of a plurality of pair pages of a block of a TLC flash memory;

FIGS. 4A, 4B, and 4C show a plurality of stages of data writing of the flash memory according to an embodiment of the invention;

FIGS. 7A, 7B, and 7C show a plurality of stages of data writing of the flash memory according to an embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
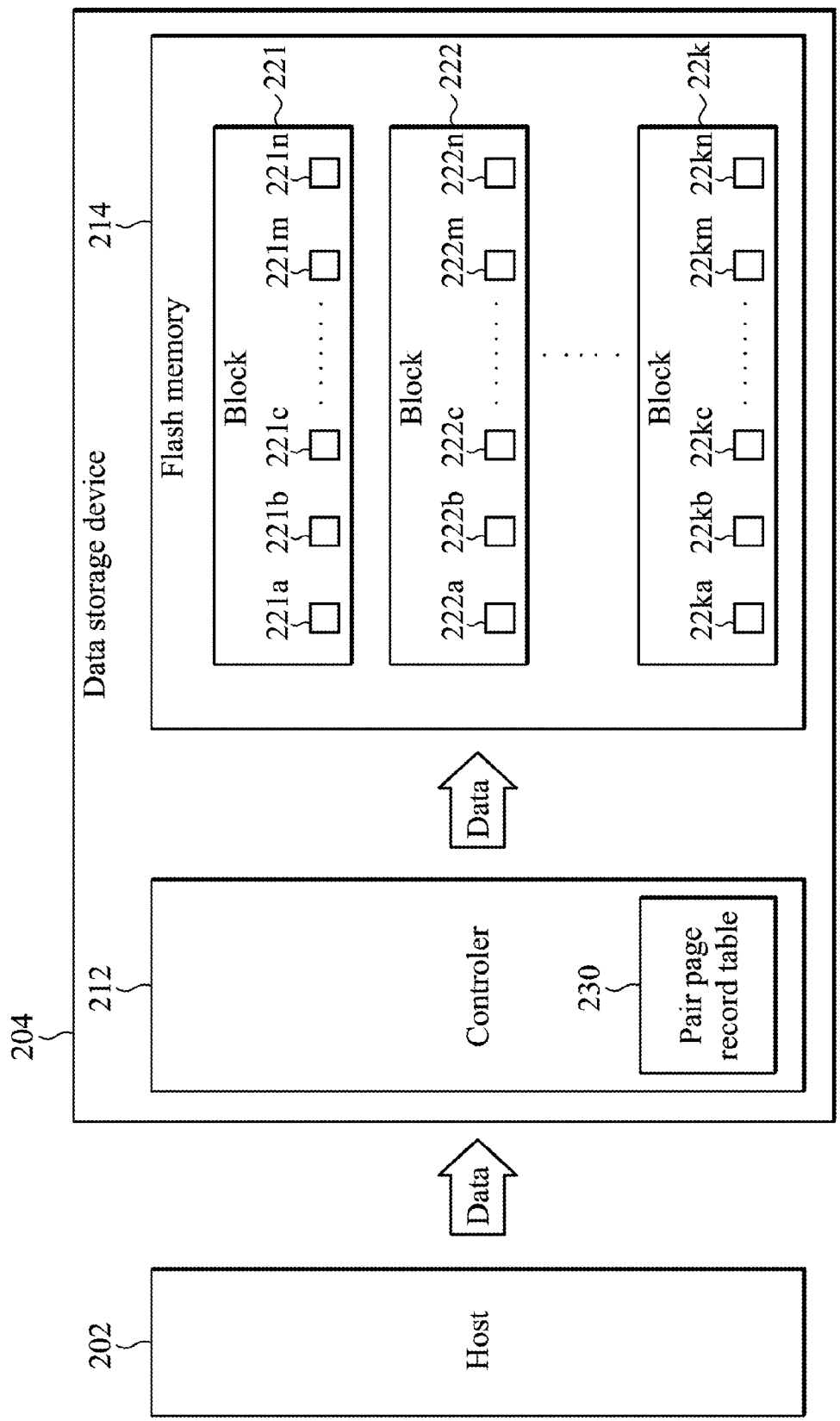
FIG. 2 is a block diagram of a data storage device capable of extending data retention of important data according to the invention.

Referring to FIG. 2, a block diagram of a data storage device 204 capable of extending data retention of important data according to the invention is shown. The data storage device 204 is coupled to a host 202. In one embodiment, the data storage device 204 comprises a controller 212 and a flash memory 214. In one embodiment, the flash memory 214 is an MLC flash memory or a TLC flash memory. The flash memory 214 comprises a plurality of blocks 221~22K for storing data. Each block comprises a plurality of pages. For example, the block 221 comprises pages 221a~221n, and the block 22k comprises pages 22ka~22kn. The pages of each block can be further divide into a plurality of pair pages. When the flash memory 214 is an MLC flash memory, each pair page comprises a strong page and a weak page. When the flash memory 214 is a TLC flash memory, each pair page comprises a strong page, a weak page, and a very weak page.

Before the controller 212 writes target data to the flash memory 214, the controller 212 determines whether the target data is important data. If the target data is ordinary data rather than important data, the controller 212 writes the target data to the flash memory 214 according an ordinary procedure. For example, if the controller 212 wants to write ordinary data to the block 221, the controller 212 directs the flash memory 214 to sequentially write to the pages 221a~221n of the block 221 without determining whether the pages 221a~221n are strong pages, weak pages, or very weak pages. On the other hand, when the target data is important data, the controller 212 merely uses strong pages of a block to store the target data, and write predetermined data to the weak pages and the very weak pages corresponding to the strong pages, wherein the predetermined data, stored in the weak pages and the very weak pages, extends the data duration of the target data stored in the corresponding strong pages. Thus, when the important data is read from the flash memory 214 with a high frequency, the read-out important data still has a low error rate.

Figure 3:
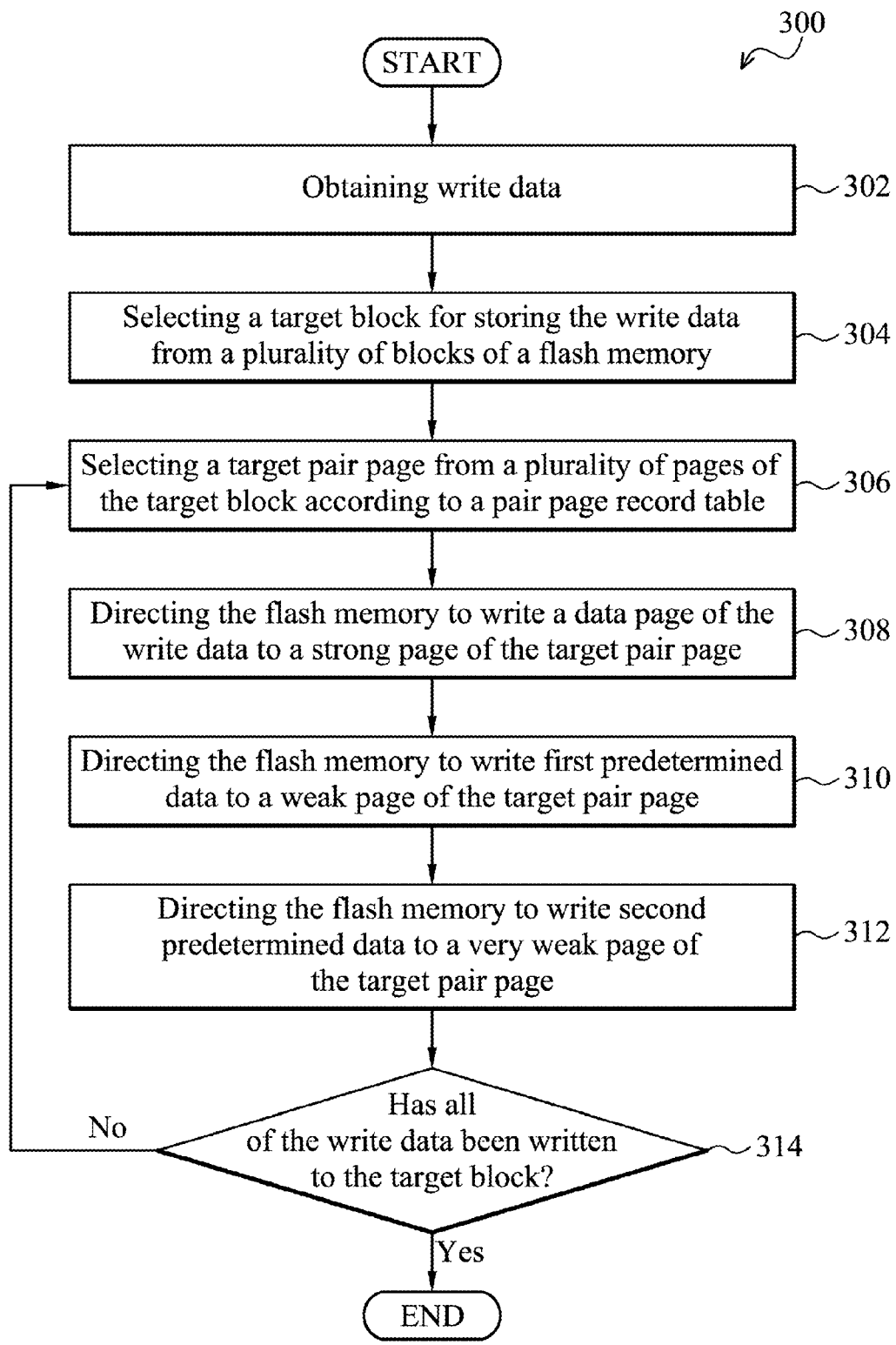
FIG. 3 is a flowchart of a method for writing data to a flash memory according to the invention.

Referring to FIG. 3, a flowchart of a method 300 for writing data to a flash memory 214 according to the invention is shown. First, the controller 212 obtains a write data to be written to the flash memory 214 (step 302). The write data may be user data obtained from the host 202, or may be system data directly generated by the controller 212. When the controller 212 determines the write data to be important data, the controller 212 must ensure the write data of long data duration. The controller 212 therefore selects a target block for storing the write data from a plurality of blocks 221~22k (step 304). The controller 212 then selects a target pair page from a plurality of pages of the target block according to a pair page record table 230 (step 306). The pair page record table 230 records page numbers of a plurality of pair pages of a block. In one embodiment, the pair page record table records information as shown in FIG. 1. The controller 212 can therefore determine whether a specific page of the block is a strong page, a weak page, or a very weak page according to the information stored in the pair page record table 230.

Assume that the flash memory 214 is a TLC flash memory. Thus, the target pair page selected by the controller 212 in the step 306 comprises a strong page, a weak page, and a very weak page. First, the controller 212 directs the flash memory 214 to write a data page of the write data to a strong page of the target pair page (step 308). The controller 212 then directs the flash memory 214 to write a first predetermined data to a weak page of the target pair page (step 310), wherein the weak page storing the first predetermined data extends the data duration of the storing page storing the data page of the write data. In one embodiment, the first predetermined data is a data page filled with merely bits "1". The controller 212 then directs the flash memory 214 to write a second predetermined data to a very weak page of the target pair page (step 312), wherein the very weak page storing the second predetermined data extends the data duration of the storing page storing the data page of the write data. In one embodiment, the second predetermined data is a data page filled with merely bits "1". In another embodiment, the second predetermined data is a data page filled with merely bits "0". Because only one data page of the write data has been written to the flash memory 214, the controller 212 selects another pair page from the flash memory 214 as a new target pair page according to the step 306, and respectively writes a subsequent data page, the first predetermined data, and the second predetermined data to the strong page, the weak page, and the very weak page of the new target pair page according to the steps 308, 310, and 312. The steps 306~312 are repeatedly performed until all data pages of the write data has been written to the target block (step 314). If the flash memory 214 is an MLC flash memory, the controller 212 can still write data to the flash memory 214 according to the method 300 shown in FIG. 3, except that the step 312 is omitted.

At steps 308, 310, and 312, the controller 212 respectively write the write data, the first predetermined data, and the second predetermined data to a strong page, a weak page, and a very weak page of a target pair page of the flash memory 214. In one embodiment, the controller 212 sends a Joint Page Programming Command to the flash memory 214 to perform the steps 308, 310, and 312. First, the controller 212 sends a first portion code 0x82 of the Joint Page Programming Command, a code 0x13, and the address of the strong page to the flash memory 214 to direct the flash memory 214 to write the data page of the write data to the strong page. The controller 212 then sends a second portion code 0x83 of the Joint Page Programming Command, the code 0x13, and the address of the weak page to the flash memory 214 to direct the flash memory 214 to write the first predetermined data to the weak page. The controller 212 then sends a third portion code 0x84 of the Joint Page Programming Command, the code 0x13, and the address of the very weak page to the flash memory 214 to direct the flash memory 214 to write the second predetermined data to the very weak page.

Referring to FIGS. 4A, 4B, and 4C, a plurality of stages of data writing of the flash memory 214 according to an embodiment of the invention is shown. Assume that the controller 212 obtains important data to be written to a target block of the flash memory 214, and the target block comprises a plurality of pages P0~P191. The pages P0-P191 of the target block is divided into a plurality of pair pages, wherein the pages P0, P4, and P10 are respectively a strong page, a weak page, and a very weak page of a first pair page, the pages P1, P5, and P11 are respectively a strong page, a weak page, and a very weak page of a second pair page, and the pages P2, P8, and P16 are respectively a strong page, a weak page, and a very weak page of a third pair page. First, the controller 212 determines to write data to the first pair page of the target block. The controller 212 therefore writes a first data page $D_1$ of the important data to the strong page P0 of the first pair page, then writes first predetermined data $D_A$ to the weak page P4 of the first pair page, and then writes second predetermined data $D_B$ to the very weak page P10 of the first pair page, as shown in FIG. 4A.

The controller 212 then determines to write data to the second pair page of the target block. The controller 212 therefore writes a second data page $D_2$ of the important data to the strong page P1 of the second pair page, then writes first predetermined data $D_A$ to the weak page P5 of the second pair page, and then writes second predetermined data $D_B$ to the very weak page P11 of the second pair page, as shown in FIG. 4B. The controller 212 then determines to write data to the third pair page of the target block. The controller 212 therefore writes a third data page $D_3$ of the important data to the strong page P2 of the third pair page, then writes first predetermined data $D_A$ to the weak page P8 of the third pair page, and then writes second predetermined data $D_B$ to the very weak page P16 of the third pair page, as shown in FIG. 4C. Because first predetermined data and second predetermined data are respectively written to the weak pages and the very weak pages of the first pair page, the second pair page, and the third pair page, the data duration of the data pages of the important data stored in the strong pages of the first pair page, the second pair page, and the third pair page may be therefore extended.

In one embodiment, the important data $D_1$, $D_2$, and $D_3$ is system data. For example, the important data $D_1$, $D_2$, and $D_3$ is an address or a number of error blocks in the flash memory 214, or data of a link table which stores information about logical addresses and corresponding physical addresses required by the controller 212 to access the flash memory 214. In one embodiment, the first predetermined data $D_A$ is a data page filled with bits "1", and the second predetermined data $D_B$ is a data page filled with bits "1" or "0". The bit contents of the first predetermined data $D_A$ and the second predetermined data $D_B$ stored in the weak pages and the very weak pages can extend the data duration of the system data $D_1$, $D_2$, and $D_3$ stored in the strong pages. In another embodiment, the important data is user data, such as an image file, a video file, or a text file, wherein the format of the image file may be JPG or GIF, the format of the video file may be AVI, and the format of the text file may be a WORD file.

Figure 5:
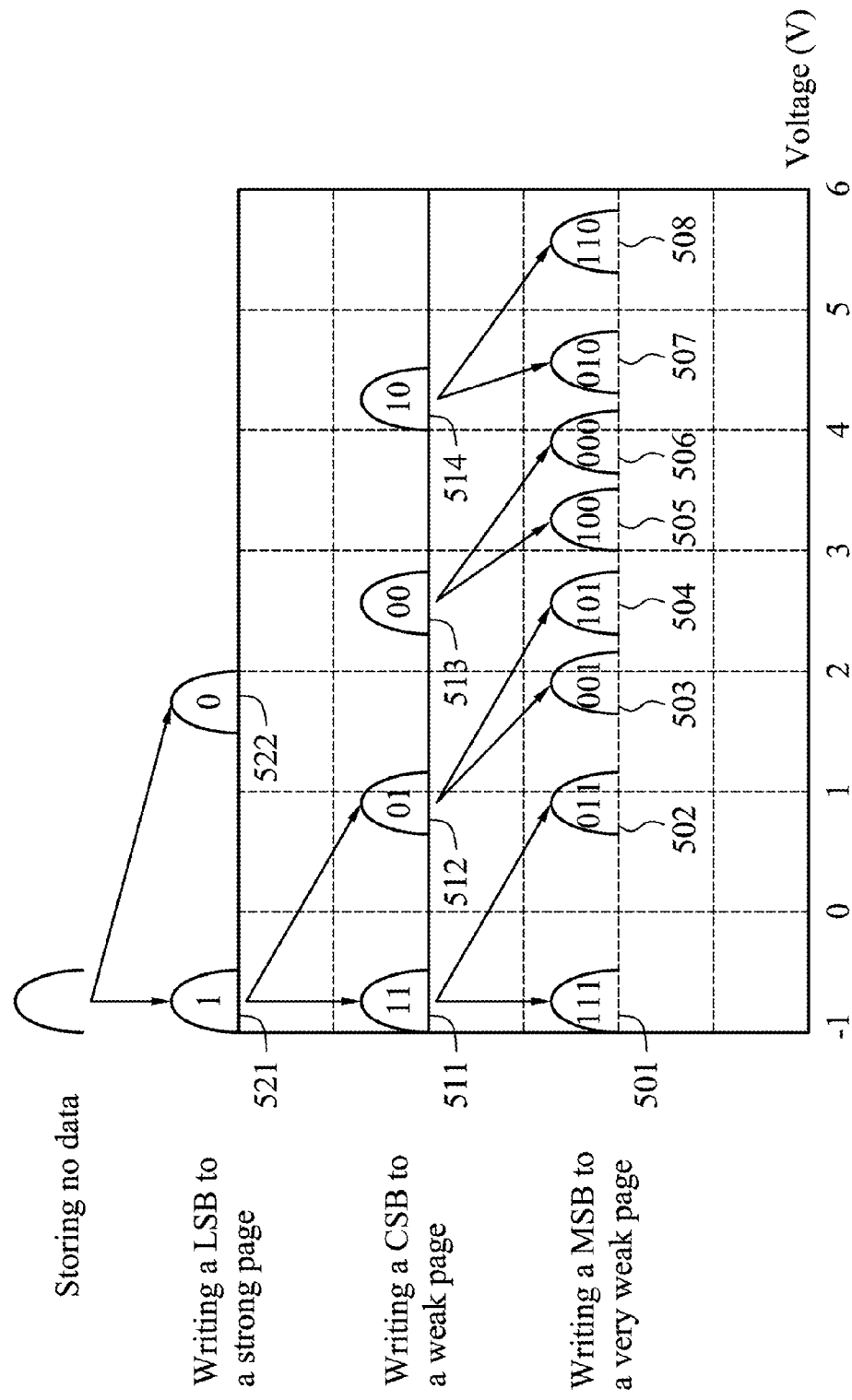
FIG. 5 is a schematic diagram of data writing of a pair page of a TLC flash memory.

Referring to FIG. 5, a schematic diagram of data writing of a pair page of a TLC flash memory is shown. A pair page of a TLC flash memory comprises a strong page, a weak page, and a very weak page. The controller sequentially writes data into the strong page, the weak page, and the very weak page of the pair page. First, the controller writes a least significant bit (LSB) into the strong page, wherein the least significant bit mat be a bit 0 or a bit 1, and a memory cell written with the LSB has a voltage distribution 521 or 522 as shown in FIG. 5. The controller then writes a center significant bit (CSB) into the weak page. When the center significant bit is a bit 1, the voltage distribution of the memory cell written with the CSB has a voltage distribution 511 or 514 as shown in FIG. 5. The voltage difference between the voltage distribution 511 and 514 is greatest in comparison with other voltage distributions. When the memory cell is read, the controller can therefore easily determine whether the LSB of the memory cell is a bit 1 or a bit 0 by easily identifying the voltage distribution 511 from the voltage distribution 514. Thus, when the predetermined data written to the weak page of a pair page is a bit 1, the data duration of the data bit stored in the corresponding strong page is extended.

The controller then writes a most significant bit (MSB) into the very weak page. When the most significant bit is a bit 1, the voltage distribution of the memory cell written with the MSB has voltage distribution 501 or 508 as shown in FIG. 5. When the most significant bit is a bit 0, the voltage distribution of the memory cell written with the MSB has voltage distribution 502 or 507 as shown in FIG. 5. The voltage difference between the voltage distribution 501 and 508 is large in comparison with other voltage distributions. When the memory cell is read, the controller can therefore easily determine whether the LSB of the memory cell is a bit 1 or a bit 0 by easily identifying the voltage distribution 501 from the voltage distribution 508. Thus, when the predetermined data written to the weak page of a pair page is a bit 1, the data duration of the data bit stored in the corresponding strong page is extended. Similarly, the voltage difference between the voltage distribution 502 and 507 is large in comparison with other voltage distributions. When the memory cell is read, the controller can therefore easily determine whether the LSB of the memory cell is a bit 1 or a bit 0 by easily identifying the distribution of the voltage 502 from the distribution of the voltage 507. Thus, when the predetermined data written to the weak page of a pair page is a bit 0, data duration of the data bit stored in the corresponding strong page is also extended.

Figure 6A:
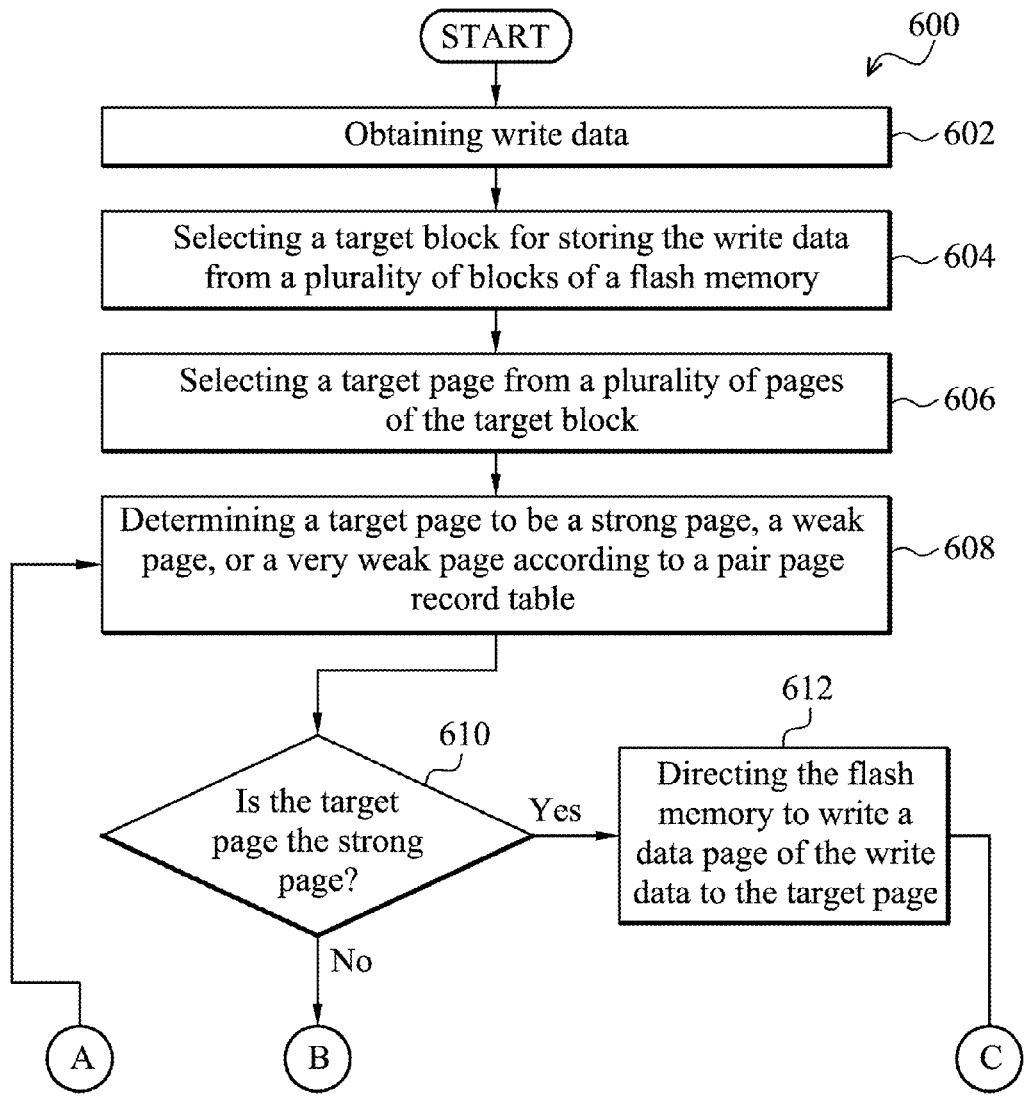
FIG. 6 is a flowchart of a data writing method of a flash memory according to the invention.
Figure 6B:
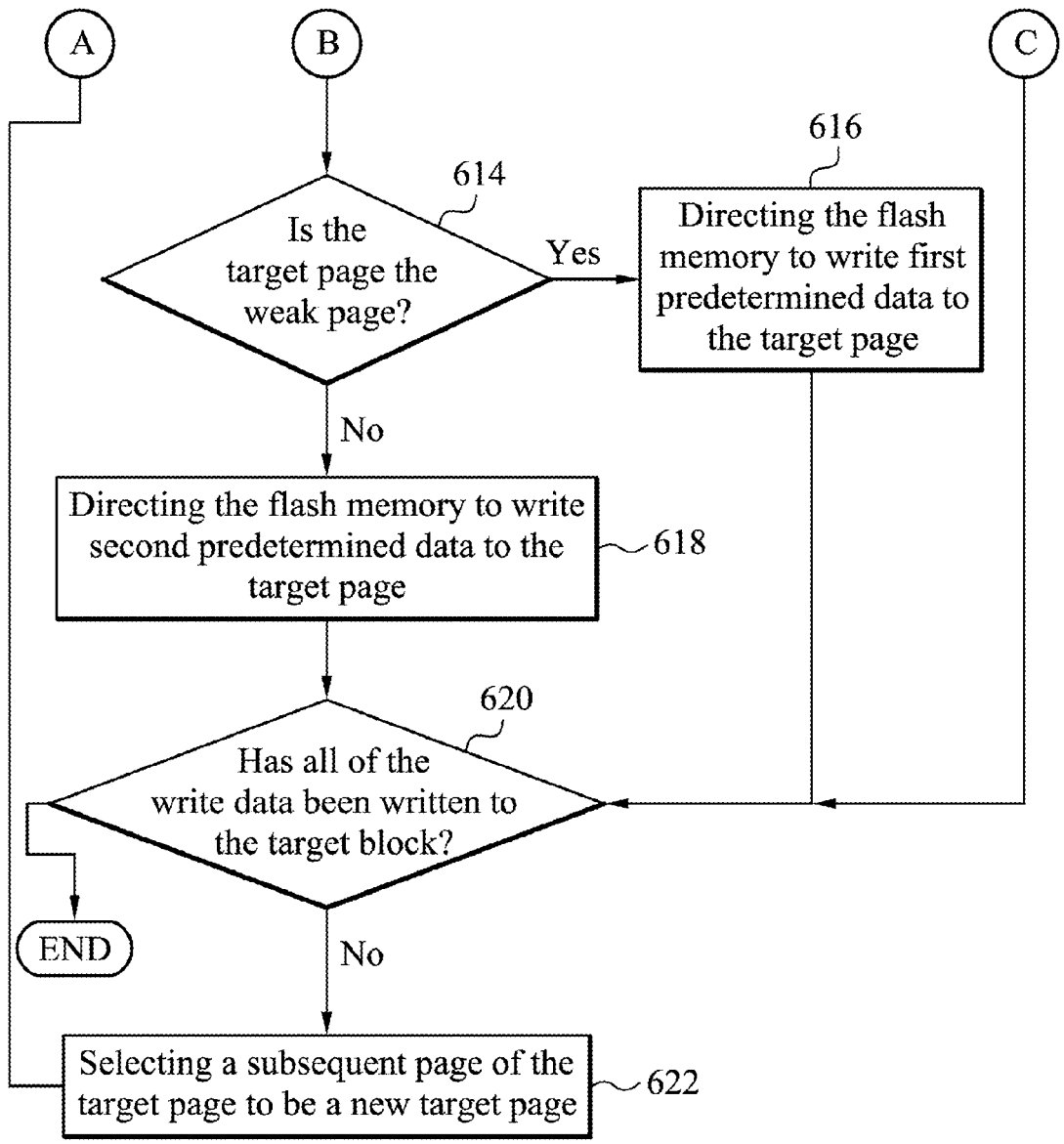

Referring to FIG. 6, a flowchart of a data writing method 600 of a flash memory 214 according to the invention is shown. First, the controller 212 obtains a write data to be written to the flash memory 214 (step 602). The write data may be user data obtained from the host 202, or may be system data directly generated by the controller 212. When the controller 212 determines the write data to be important data, the controller 212 must extend the data duration of the write data. The controller 212 therefore selects a target block for storing the write data from a plurality of blocks 221~22k (step 604). The controller 212 then selects a target page from a plurality of pages of the target block (step 606). Assume that the flash memory 214 is a TLC flash memory. The controller 212 then determines whether the target page is a strong page, a weak page, or a very weak page according to a pair page record table 230 (step 608). In one embodiment, the pair page record table records information as shown in FIG. 1. The controller 212 can therefore determine whether the target page of the block is a strong page, a weak page, or a very weak page according to the information stored in the pair page record table 230.

When the controller 212 determines the target page to be a strong page (step 610), the controller 212 directs the flash memory to write a data page of the write data to the target page (step 612). Otherwise, when the controller 212 determines the target page to be a weak page (step 614), the controller 212 directs the flash memory to write the first predetermined data to the target page (step 616), wherein the first predetermined data stored in the target page extends a data duration of a strong page corresponding to the target page. In one embodiment, the first predetermined data is a data page filled with bits "1". When the controller 212 determines the target page to be a very weak page (step 614), the controller 212 directs the flash memory to write the second predetermined data to the target page (step 618), wherein the second predetermined data stored in the target page extends a data duration of a strong page corresponding to the target page. In one embodiment, the second predetermined data is a data page filled with bits "1". In another embodiment, the second predetermined data is a data page filled with bits "0". The controller 212 then selects a subsequent page of the target page to be a new target page (step 622), and writes data to the new target page according to steps 608~618 until all of the write data has been written to the target block (step 620). When the flash memory 214 is an MLC flash memory, the controller 212 still writes data to the flash memory 214 according to the method 600, wherein the step 618 of method 600 is omitted.

Referring to FIGS. 7A, 7B, and 7C, a plurality of stages of data writing of the flash memory 214 according to an embodiment of the invention is shown. Assume that the controller 212 obtains important data to be written to a target block of the flash memory 214, and the target block comprises a plurality of pages P0~P191. The pages P0~P191 of the target block are divided into strong pages, weak pages, and very weak pages, wherein the pages P0~P3 and P6~P7 are strong pages, the pages P4~P5 and P8~P9 are weak pages, and the pages P10~P11 and P16~P17 are very weak pages. First, the controller 212 determines to sequentially write data to the pages P0~P3 of the target block. The controller 212 therefore writes a first data page $D_1$ of the important data to the strong page P0, then writes a second data page $D_2$ of the important data to the strong page P1, then writes a third data page $D_3$ of the important data to the strong page P2, and then writes a fourth data page $D_4$ of the important data to the strong page P3, as shown in FIG. 7A.

The controller 212 then determines to sequentially write data to the pages P4~P7 of the target block. Because the pages P4 and P5 are weak pages, the controller 212 therefore writes first predetermined data $D_A$ to the weak pages P4 and P5. Because the pages P6 and P7 are strong pages, the controller 212 therefore writes a fifth data page $D_5$ of the important data to the strong page P6, and then writes a sixth data page $D_6$ of the important data to the strong page P7, as shown in FIG. 7B. The controller 212 then determines to sequentially write data to the pages P8~P11 of the target block. Because the pages P8 and P9 are weak pages, the controller 212 therefore writes first predetermined data $D_A$ to the weak pages P8 and P9. Because the pages P10 and P11 are very weak pages, the controller 212 therefore writes second predetermined data $D_B$ to the weak pages P10 and P11, as shown in FIG. 7C. Because first predetermined data and second predetermined data are respectively written to the weak pages and the very weak pages, the data duration of the data pages of the important data stored in the corresponding strong pages is therefore extended.

In one embodiment, the important data $D_1$, $D_2$, and $D_3$ is system data. For example, the important data $D_1$, $D_2$, and $D_3$ is an address or a number of error blocks in the flash memory 214, or data of a link table which stores information about logical address and corresponding physical address required by the controller 212 to access the flash memory 214. In one embodiment, the first predetermined data $D_A$ is a data page filled with bits "1", and the second predetermined data $D_B$ is a data page filled with bits "1" or "0". The bit contents of the first predetermined data $D_A$ and the second predetermined data $D_B$ stored in the weak pages and the very weak pages can extend the data duration of the system data $D_1$, $D_2$, and $D_3$ stored in the strong pages. In another embodiment, the important data is user data, such as an image file, a video file, or a text file, wherein the format of the image file may be JPG or GIF, the format of the video file may be AVI, and the format of the text file may be a WORD file.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data writing method for a flash memory, comprising:
   selecting a target block for storing write data from a plurality of blocks of the flash memory;
   selecting a target pair page from a plurality of pair pages of the target block according to a pair page record table, wherein the pair page comprises a strong page and a weak page;
   directing the flash memory to write a data page of the write data to the strong page of the target pair page; and
   directing the flash memory to write first predetermined data to the weak page of the target pair page, wherein the weak page storing the first predetermined data extends the data duration of the strong page of the target pair page; and
   repeating selection of the target pair page, writing of the data page, and writing of the first predetermined data until all of the write data are written to the target block.

2. The data writing method as claimed in claim 1, wherein the flash memory is a multi-layer cell (MLC) flash memory, and the first predetermined data is a data page filled with merely data bits 1.

3. The data writing method as claimed in claim 1, wherein the flash memory is a triple-layer cell (TLC) flash memory, the target pair page further comprises a very weak page in addition to the strong page and the weak page, and the data writing method further comprises:
   directing the flash memory to write second predetermined data to the very weak page of the target pair page, wherein the very weak page storing the second predetermined data extends the data duration of the strong page of the target pair page,
   wherein the repeating step further comprises repeating writing of the second predetermined data.

4. The data writing method as claimed in claim 3, wherein the first predetermined data is a data page filled with merely data bits 1, and the second predetermined data is a data page filled with merely data bits 0.

5. The data writing method as claimed in claim 3, wherein the first predetermined data is a data page filled with merely data bits 1, and the second predetermined data is a data page filled with merely data bits 1.

6. The data writing method as claimed in claim 2, wherein writing of the data page comprises sending a first portion code 0x82 of a Joint Page Programming Command, a code 0x13, and the address of the strong page to the flash memory, writing of the first predetermined data comprises sending a second portion code 0x83 of the Joint Page Programming Command, the code 0x13, and the address of the weak page to the flash memory, and writing of the second predetermined data comprises sending a third portion code 0x84 of the Joint Page Programming Command, the code 0x13, and the address of the very weak page to the flash memory.

7. A data writing method for a flash memory, comprising:
- selecting a target block for storing write data from a plurality of blocks of the flash memory;
- selecting a target page from a plurality of pages of the target block;
- determining whether the target page is a strong page according to a pair page record table;
- when the target page is the strong page, directing the flash memory to write a data page of the write data to the target page;
- when the target page is not the strong page, directing the flash memory to write a predetermined data to the target page, wherein the weak page storing the predetermined data extends the data duration of the strong page of the target pair page;
- repeating selection of the target page, determining of whether the target page is the strong page, and writing of the data page or writing of the predetermined data until all of the write data are written to the target block.

8. The data writing method as claimed in claim 7, wherein the flash memory is a multi-layer cell (MLC) flash memory, and the predetermined data is a data page filled with merely data bits 1.

9. The data writing method as claimed in claim 1, wherein the flash memory is a triple-layer cell (TLC) flash memory, and writing of the predetermined data further comprises:
- determining whether the target page is a weak page or a very weak page;
- when the target page is the weak page, directing the flash memory to write first predetermined data to the target page; and
- when the target page is the very weak page, directing the flash memory to write second predetermined data to the target page.

10. The data writing method as claimed in claim 9, wherein the first predetermined data is a data page filled with merely data bits 1, and the second predetermined data is a data page filled with merely data bits 0.

11. The data writing method as claimed in claim 9, wherein the first predetermined data is a data page filled with merely data bits 1, and the second predetermined data is a data page filled with merely data bits 1.

12. A data storage device, comprising:
- a flash memory, comprising a plurality of blocks, wherein each of the blocks comprises a plurality of pair pages, and each of the pair pages comprises a strong page and a weak page; and
- a controller, coupled to the flash memory, selecting a target block from a plurality of blocks of the flash memory, writing user data or system data to the strong pages of the target block, and writing first predetermined data to the weak pages of the target block,
- wherein the weak pages storing the first predetermined data extends the data duration of the corresponding strong pages.

13. The data storage device as claimed in claim 12, wherein the flash memory is a multi-layer cell (MLC) flash memory, and the first predetermined data is a data page filled with merely data bits 1.

14. The data storage device as claimed in claim 12, wherein the flash memory is a triple-layer cell (TLC) flash memory, each of the pair pages further comprises a very weak page in addition to the strong page and the weak page, and the controller writes second predetermined data to the very weak pages of the target block, wherein the very weak pages storing the second predetermined data extends the data duration of the corresponding strong pages.

15. The data storage device as claimed in claim 14, wherein the first predetermined data is a data page filled with merely data bits 1, and the second predetermined data is a data page filled with merely data bits 0.

16. The data storage device as claimed in claim 14, wherein the first predetermined data is a data page filled with merely data bits 1, and the second predetermined data is a data page filled with merely data bits 1.

* * * * *